(12) United States Patent
Zhou et al.

(10) Patent No.: US 10,356,349 B2
(45) Date of Patent: *Jul. 16, 2019

(54) LIGHT FIELD CAPTURE CONTROL METHODS AND APPARATUSES, LIGHT FIELD CAPTURE DEVICES

(71) Applicant: BEIJING ZHIGU TECH CO., LTD., Beijing (CN)

(72) Inventors: Liang Zhou, Beijing (CN); Lin Du, Beijing (CN)

(73) Assignee: BEIJING ZHIGU TECH CO., LTD., Beijing (CN)

( * ) Notice: Subject to any disclaimer, the term of this patent is extended or adjusted under 35 U.S.C. 154(b) by 58 days.

This patent is subject to a terminal disclaimer.

(21) Appl. No.: 15/507,963

(22) PCT Filed: Aug. 26, 2015

(86) PCT No.: PCT/CN2015/088101
§ 371 (c)(1),
(2) Date: Mar. 1, 2017

(87) PCT Pub. No.: WO2016/037528
PCT Pub. Date: Mar. 17, 2016

(65) Prior Publication Data
US 2017/0264843 A1  Sep. 14, 2017

(30) Foreign Application Priority Data
Sep. 9, 2014  (CN) .......................... 2014 1 0455443

(51) Int. Cl.
*H04N 5/369* (2011.01)
*H04N 5/232* (2006.01)
(Continued)

(52) U.S. Cl.
CPC ......... *H04N 5/3696* (2013.01); *G06K 9/4604* (2013.01); *H01L 27/14625* (2013.01); *H04N 5/232* (2013.01); *H04N 5/23229* (2013.01)

(58) Field of Classification Search
None
See application file for complete search history.

(56) References Cited

U.S. PATENT DOCUMENTS

| | | |
|---|---|---|
| 5,076,687 A | 12/1991 | Adelson |
| 2006/0119903 A1* | 6/2006 | Chiba ................ H04N 5/23212 358/474 |

(Continued)

FOREIGN PATENT DOCUMENTS

| | | |
|---|---|---|
| CN | 1726430 | 1/2006 |
| CN | 102099916 | 6/2011 |

(Continued)

OTHER PUBLICATIONS

International Search Report and Written Opinion for Application No. PCT/CN2015/088101, dated Dec. 21, 2015, 8 pages.
(Continued)

*Primary Examiner* — Paul M Berardesca
(74) *Attorney, Agent, or Firm* — Sheppard Mullin Richter & Hampton LLP

(57) ABSTRACT

Embodiments of the subject application disclose various light field capture control methods and apparatuses and various light field capture devices, wherein one of the light field capture control methods comprises: determining at least one sub-lens, which affects light field capture of a first region, in a sub-lens array of a light field camera, the first region being a local part of a to-be-shot scene; determining a to-be-adjusted region of an image sensor of the light field camera according to the at least one sub-lens; adjusting pixel density distribution of the image sensor, to cause average pixel density distribution of the to-be-adjusted region to be
(Continued)

distinguished from that of other regions of the image sensor; and performing, by the adjusted image sensor, light field capture of the to-be-shot scene. The technical solution provided in the embodiments of the subject application improves light field capture efficiency while making full use of overall pixels of the image sensor, and can better meet users' diversified actual application demands.

27 Claims, 10 Drawing Sheets

(51) Int. Cl.
  *G06K 9/46* (2006.01)
  *H01L 27/146* (2006.01)

(56) References Cited

U.S. PATENT DOCUMENTS

| | | | |
|---|---|---|---|
| 2008/0151089 | A1 | 6/2008 | Street et al. |
| 2010/0026852 | A1 | 2/2010 | Ng et al. |
| 2010/0271467 | A1 | 10/2010 | Akeley |
| 2011/0310125 | A1 | 12/2011 | McEldowney et al. |
| 2012/0113302 | A1 | 5/2012 | Tajiri |
| 2013/0135515 | A1 | 5/2013 | Abolfadl et al. |
| 2013/0250159 | A1 | 9/2013 | Nagasaka |
| 2015/0125943 | A1 | 5/2015 | Molnar et al. |

FOREIGN PATENT DOCUMENTS

| | | | |
|---|---|---|---|
| CN | 102332090 | | 1/2012 |
| CN | 102739945 | A | 10/2012 |
| CN | 103019021 | | 4/2013 |
| CN | 103327223 | | 9/2013 |
| CN | 104159025 | A | 11/2014 |
| CN | 104469147 | * | 3/2015 |
| CN | 104506762 | A | 4/2015 |
| WO | 2013/169671 | A1 | 11/2013 |

OTHER PUBLICATIONS

Search Report for Chinese Application No. 201410455443.X, dated Dec. 25, 2017, 1 page.

* cited by examiner

LIGHT FIELD CAPTURE CONTROL METHODS AND APPARATUSES, LIGHT FIELD CAPTURE DEVICES

CROSS-REFERENCE TO RELATED APPLICATIONS

This application is a national phase application of International Application No. PCT/CN2015/088101, filed on Aug. 26, 2015, which claims the benefit of priority to Chinese Patent Application No. 201410455443.X, filed on Sep. 9, 2014, and entitled "Light Field Capture Control Methods and Apparatuses and Light Field Capture Devices", each of which is incorporated by reference herein in its entirety.

TECHNICAL FIELD

The subject application relates to the field of light field capture technologies, and in particular, to various light field capture control methods and apparatuses and various light field capture devices.

BACKGROUND

A light field camera is an imaging technology that uses a sub-lens array to record and reproduce a three-dimensional scene, which usually places a sub-lens array between a main lens and an image sensor such as CCD, and records, through the sub-lens array, light field information of different directions of a three-dimensional scene on a focal plane of the sub-lens array.

Distinguished from the two-dimensional image capture manner of the traditional camera, the light field camera can record four-dimensional light field information (such as space and views) of a three-dimensional scene through single exposure, supports "first shoot and then focus" (i.e., focusing is not necessary during shooting), can generate rich image effects by processing shot images, and can meet multiple imaging applications, for example, digital re-focusing, change of view, depth images, three-dimensional reconstruction and the like. However, although the light field camera increases the flexibility of single-exposure imaging, it records view direction information of light of objects through spatial resolution of a lost image, therefore, spatial resolution of an image obtained through shooting will be significantly reduced when a three-dimensional scene is shot based on a light field camera.

SUMMARY

A brief summary about the subject application is given hereinafter, so as to provide a basic understanding about certain aspects of the subject application. It should be understood that the summary is not an exhaustive summary about the subject application. It is neither intended to determine critical or important parts of the subject application, nor intended to limit the scope of the subject application. Its purpose is merely giving some concepts in a simplified form, to be taken as the preamble to be described later in more detail.

The subject application provides various light field capture control methods and apparatuses and various light field capture devices.

In one aspect, embodiments of the subject application provide a light field capture control method, comprising:

determining at least one sub-lens, which affects light field capture of a first region, in a sub-lens array of a light field camera, the first region being a local part of a to-be-shot scene;

determining a to-be-adjusted region of an image sensor of the light field camera according to the at least one sub-lens;

adjusting pixel density distribution of the image sensor, to cause average pixel density distribution of the to-be-adjusted region to be distinguished from that of other regions of the image sensor; and performing, by the adjusted image sensor, light field capture of the to-be-shot scene.

In another aspect, the embodiments of the subject application further provide a light field capture control apparatus, comprising:

a sub-lens determination module, configured to determine at least one sub-lens, which affects light field capture of a first region, in a sub-lens array of a light field camera, the first region being a local part of a to-be-shot scene;

a to-be-adjusted region determination module, configured to determine a to-be-adjusted region of an image sensor of the light field camera according to the at least one sub-lens;

a pixel density distribution adjustment module, configured to adjust pixel density distribution of the image sensor, to cause average pixel density distribution of the to-be-adjusted region to be distinguished from that of other regions of the image sensor; and a light field capture module, configured to perform, by the adjusted image sensor, light field capture of the to-be-shot scene.

In a further aspect, the embodiments of the subject application provide a light field capture device, comprising a light field camera and the light field capture control apparatus, the light field capture control apparatus being connected with the light field camera.

The technical solution provided in the embodiments of the subject application determines a to-be-adjusted region of an image sensor according to at least one sub-lens, which affects light field capture of a first region of a to-be-shot scene, in a sub-lens array of a light field camera, and adjusts pixel density distribution of the image sensor, to cause average pixel density distribution of the to-be-adjusted region to be distinguished from that of other regions of the image sensor, that is, the adjusted pixel density distribution of the image sensor is not evenly distributed, and when light field capture of the to-be-shot scene is performed via the adjusted image sensor, light field information of different regions of the to-be-shot scene recorded by the image sensor is not even, which thus improves light field capture efficiency while making full use of overall pixels of the image sensor, and can better meet users' diversified actual application demands.

These and other advantages of the subject application will be more evident through the following detailed description about optional embodiments of the subject application with reference to the accompanying drawings.

BRIEF DESCRIPTION OF THE DRAWINGS

The subject application can be better understood with reference to the description given below in combination with the accompanying drawings, in which the same or similar reference signs are used in all the drawings to indicate the same or similar components. The drawings together with the following detailed description are comprised in the specification and form a part of the specification, and are configured to further exemplify alternative embodiments of the subject application and explain the principle and advantages of the subject application. In the drawings.

Figure 1A:
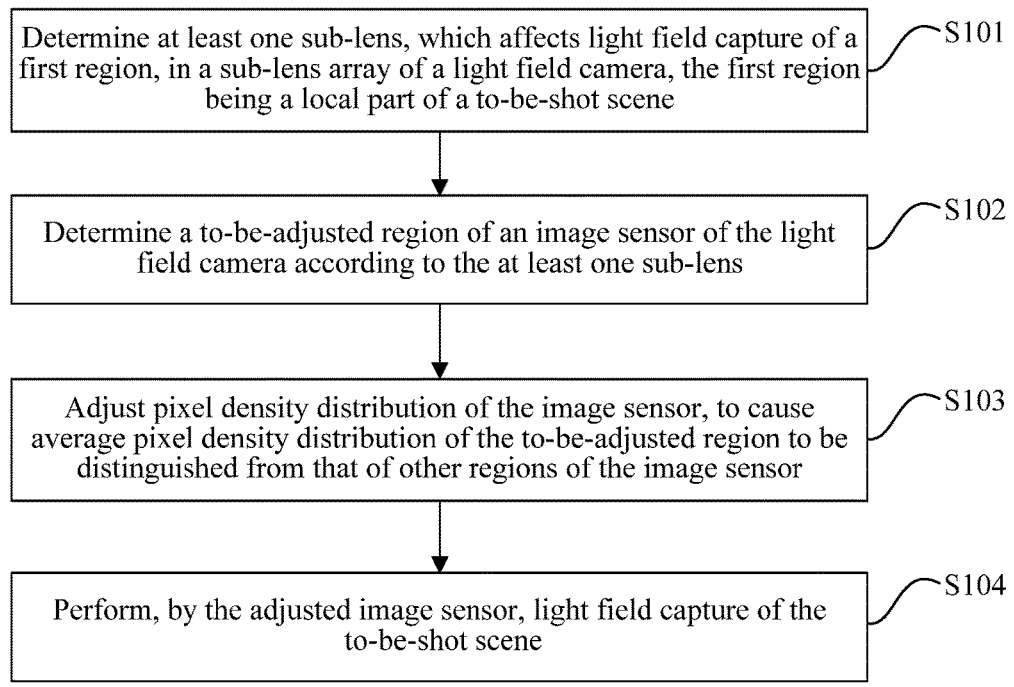
FIG. 1a is a flowchart of a light field capture control method according to one embodiment of the subject application.

Those skilled in the art should understand that, elements in the drawings are merely illustrated for the sake of simplicity and clarity, and may not be drawn to scale. For example, sizes of certain elements in the drawings may be amplified relative to other elements, so as to help to improve the understanding about the embodiments of the subject application.

DETAILED DESCRIPTION

Exemplary embodiments of the subject application are described below in detail with reference to the accompanying drawings. For the sake of clarity and simplicity, not all the features of actual implementations are described in the specification. However, it should be understood that, lots of decisions specific to implementations must be made during development of any such actual embodiment, so as to achieve specific goals of developers, for example, restrictions relevant to systems and services are met, and the restrictions may vary with different implementations. In addition, it should also be understood that, although development work is likely to be very complicated and time-consuming, for those skilled in the art who benefit from the disclosure, the development work is merely a routine task.

Herein, it should also be noted that, in order to avoid blurring the subject application due to unnecessary details, only apparatus structures and/or processing steps closely related to solutions according to the subject application are described in the accompanying drawings and the specification, but representation and description about members and processing having little to do with the subject application and known to those of ordinary skill in the art are omitted.

Specific embodiments of the subject application are described in detail hereinafter with reference to the accompanying drawings and embodiments (in which the same elements are denoted by the same reference numerals). The following embodiments are intended to describe the subject application, but not to limit the scope of the subject application.

It should be understood by those skilled in the art that the terms such as "first" and "second" in the subject application are merely intended to distinguish different steps, devices or modules, etc., which neither represent any particular technical meaning nor indicate a necessary logical sequence between them.

The inventor of the subject application has found in the process of implementing the embodiments of the subject application that, generally, when light field capture of a to-be-shot scene is performed based on a light field camera, pixels of an image sensor are evenly distributed, and spatial resolution of images of light fields of different regions of the scene acquired based on the image sensor is the same. However, in some scenes, different regions of the scene usually have different meanings and/or significance for users, that is, users do not have the same requirements for imaging quality of different regions of the to-be-shot scene. For example, in a character shooting scene, the user is more interested in human faces in the scene than in scenery of the scene, and thus requirements for image spatial resolution of imaging of human faces are higher; and so on. To this end, the embodiments of the present invention provide a light field capture control method, which can make full use of overall pixels of the image sensor of the light field camera to acquire light field information of different regions of the to-be-shot scene in a differentiation manner, and obtains multiple parallax images with differential distribution of image definition, to thus better meet users' diversified application demands. The technical solution is further described below with reference to the accompanying drawings.

FIG. 1a is a flowchart of a light field capture control method according to one embodiment of the subject application. An execution body of the light field capture control method according to the embodiment of the subject application may be a certain light field capture control apparatus, and the light field capture control apparatus may perform static or dynamic light field capture control by executing the light field capture control method during applications, which comprise, but are not limited to, phototaking, camera shooting, photographing and video monitoring. Device manifestations of the light field capture control apparatus are not limited, for example, the light field capture control apparatus may be a certain separate component, and the component cooperates with the light field camera for communications; or the light field capture control apparatus may be integrated, as a certain functional module, into an image capture device comprising a light field camera, which is not limited in the embodiment of the subject application.

Specifically, as shown in FIG. 1a, a light field capture control method provided in the embodiment of the subject application comprises:

S101: Determine at least one sub-lens, which affects light field capture of a first region, in a sub-lens array of a light field camera, the first region being a local part of a to-be-shot scene.

The light field camera generally comprises a main lens, a sub-lens array and an image sensor disposed in sequence, and the sub-lens array comprises multiple array-distributed sub-lenses. The to-be-shot scene is a three-dimensional scene. Light rays from different directions of different object points of the to-be-shot scene are converged onto at least one sub-lens of the sub-lens array via the main lens, the light rays converged by the main lens are separated via the at least one sub-lens, the separated light rays record light intensity, direction and other information through the image sensor, thus acquiring imaging information (i.e., light field information) of multiple view directions of the to-be-shot scene, and the acquired light field information can manifest as multiple parallax images interleaved.

During actual applications, a local part of the to-be-shot scene may be determined as the first region according to actual requirements, to determine one or more sub-lenses, which affect light field capture of the first region, in the sub-lens array.

S102: Determine a to-be-adjusted region of an image sensor of the light field camera according to the at least one sub-lens.

In the light field camera, sub-lens distribution of the sub-lens array and imaging regions of the image sensor may have a certain predetermined corresponding relationship therebetween, an imaging region of the image sensor corresponding to the at least one sub-lens may be determined according to the corresponding relationship, and the determined imaging region is the to-be-adjusted region.

S103: Adjust pixel density distribution of the image sensor, to cause average pixel density distribution of the to-be-adjusted region to be distinguished from that of other regions of the image sensor.

The image sensor in the embodiment of the subject application is an image sensor with adjustable pixel density, which may comprise, but not limited to, a flexible image sensor, and the flexible image sensor comprises a flexible substrate and multiple image sensor pixels formed on the flexible substrate, wherein the flexible substrate, when meeting a certain condition, may adjust pixel density distribution thereof through expansion and contraction, bending or other changes. In combination with the characteristic that the pixel density distribution of the image sensor is adjustable, the embodiment of the subject application adjusts pixel density distribution of the image sensor, to cause average pixel density of the to-be-adjusted region of the image sensor to be distinguished from that of other regions of the image sensor. The "distinguished from" in the embodiment of the subject application is "different from", comprising "greater than" or "less than", that is to say, pixel density distribution of the image sensor is adjusted, to cause average pixel density of the to-be-adjusted region of the image sensor to be greater than that of other regions of the image sensor, or to cause average pixel density of the to-be-adjusted region of the image sensor to be less than that of other regions of the image sensor.

S104: Perform, by the adjusted image sensor, light field capture of the to-be-shot scene.

The technical solution provided in the embodiment of the subject application determines a to-be-adjusted region of an image sensor according to at least one sub-lens, which affects light field capture of a first region, in a sub-lens array of a light field camera, adjusts pixel density distribution of the image sensor, to cause average pixel density distribution of the to-be-adjusted region to be distinguished from that of other regions of the image sensor, that is, the adjusted pixel density distribution of the image sensor is not evenly distributed, and when light field capture of the to-be-shot scene is performed via the adjusted image sensor, light field information of different regions of the to-be-shot scene recorded by the image sensor is not even; it might as well takes a situation where average pixel density of the to-be-adjusted region of the image sensor is greater than that of other regions of the image sensor as an example, in the situation, light field information of the first region in the to-be-shot scene recorded by the image sensor is richer than that of other regions in the to-be-shot scene, and image spatial resolution corresponding to imaging of the first region is also higher, which thus improves light field capture efficiency while making full use of overall pixels of the image sensor, and can better meet users' diversified actual application demands.

Optionally, in technical solution provided in the embodiment of the subject application, the light field capture control method may further comprise: determining the first region. The solution can predetermine a local part of a current to-be-shot scene (e.g., a region having higher requirements for image spatial resolution, or a region having lower requirements for image spatial resolution) as the first region according to actual needs, and can better meet users' personalized application demands.

Manners of determining the first region are very flexible, which are not limited in the embodiment of the subject application. In one optional implementation, the first region can be determined according to a preview image of any view of the to-be-shot scene acquired by the light field camera. The light field camera generally comprises a viewfinder to display a preview image of any view of a current to-be-shot scene, and the solution determines the first region based on the preview image and can improve use convenience of users.

Specific implementations of determining the first region based on the preview images are also very flexible.

For example, the first region can be determined according to region of interest (ROI) information of the preview image, that is, ROI determination information of the preview image can be acquired; and the first region is determined according to the ROI determination information. The ROI may comprise, but not limited to, one or more of the following: at least one region of the preview image selected by a user (i.e., a user selection region of the preview image), at least one region of the preview image gazed by the user (i.e., a user gaze region of the preview image), and an ROI obtained by automatically detecting the preview image by the light field capture device. The solution determines a local part in the to-be-shot scene corresponding thereto as the first region according to the ROI of the preview image, or determines a local part in the to-be-shot scene not corresponding thereto as the first region, to cause determination of the first region to more fit in with actual user demands, which can better meet users' personalized application demands.

For another example, the first region can be automatically determined according to a result of image analysis on the preview image, that is, image analysis is performed on the preview image; and the first region is determined according to a result of the image analysis on the preview image. In one optional scene, face recognition can be performed on the preview image, and a face region of the to-be-shot scene corresponding to a face image is determined as the first region. The solution can determine a region in the to-be-shot scene corresponding thereto as the first region according to a result of the image analysis on the preview image, to cause determination of the first region to be more intelligent, thereby improving efficiency and universality of the determination of the first region.

Figure 2:
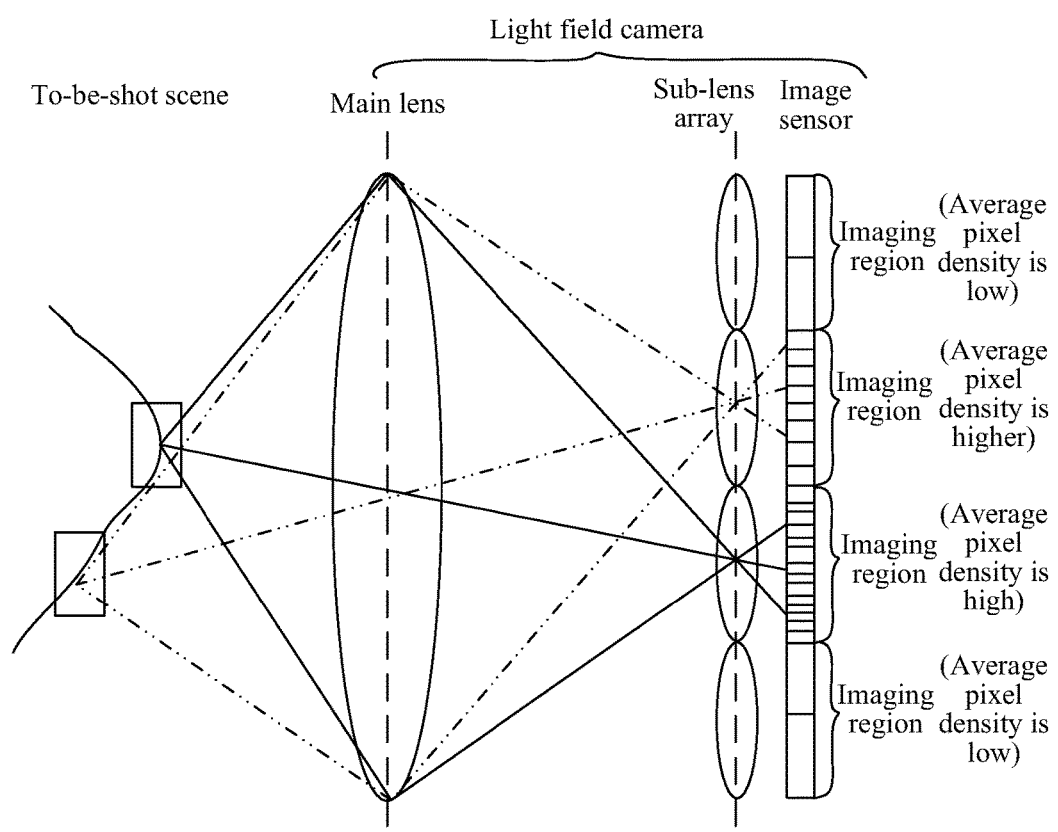
FIG. 2 is a schematic structural diagram of an optical light path of a light field camera according to one embodiment of the subject application.

Further description is given below by taking one optional structure of the light field camera as an example. As shown in FIG. 2, the light field camera comprises: a main lens, a sub-lens array and an image sensor disposed in sequence; the sub-lens array comprises multiple array-distributed sub-lenses, and the sub-lenses have the same focal length; and a distance between the image sensor and the sub-lens array is equal to the focal length of the sub-lenses. Spatial resolution of an image (such as the preview image) of a certain view of the to-be-shot scene acquired based on the light field camera corresponds to sub-lens distribution of the sub-lens array, each sub-lens corresponds to a certain imaging unit of the image sensor, and information of the sub-lens for light rays from different directions of a certain part of the to-be-shot scene is recorded through the imaging unit. That is, in the light field camera, a one-to-one corresponding relationship (hereinafter referred to as "first mapping relationship") exists between pixel distribution of the preview image and sub-lens distribution of the sub-lens array, and a one-to-one corresponding relationship (hereinafter referred to as "second mapping relationship") exists between sub-lens distribution of the sub-lens array and imaging region distribution of the image sensor.

For example, suppose that the sub-lens array comprises M×N sub-lenses, resolution of the image sensor is A×B, A×B pixels of the image sensor are divided into M×N imaging regions (A is greater than M, and B is greater than N), each imaging region corresponds to one sub-lens, configured to record light field information of light rays separated by the sub-lens, comprising light intensity, view direction and other information. A preview image of the light field camera for the to-be-shot scene is generally imaging of a certain view of the scene recorded by the image sensor, and spatial resolution of the preview image corresponds to sub-lens distribution of the sub-lens array, which is M×N.

Therefore, information such as the first region, the sub-lens which affects light field capture of the first region and the to-be-adjusted region of the image sensor can be determined according to the preview image, the first mapping relationship and the second mapping relationship. Specifically, in an implementation of determining at least one sub-lens which affects light field capture of the first region, the at least one sub-lens corresponding to pixels comprised in a sub-image, which corresponds to the first region, in the preview image can be determined according to the first mapping relationship between pixel distribution of the preview image and sub-lens distribution of the sub-lens array. Correspondingly, in an implementation of determining a to-be-adjusted region of the image sensor, an imaging region, which corresponds to the at least one sub-lens, in the image sensor as the to-be-adjusted region can be determined according to the second mapping relationship between sub-lens distribution of the sub-lens array and imaging region distribution of the image sensor. The solution is simple and easy to implement, and improves use convenience of the users.

The light field camera structure as shown in FIG. 2 is merely an optional light field camera structure on which the embodiment of the subject application can be based, but should not be understood as a limitation to the essence of the technical solution of the embodiment of the subject application.

After the to-be-adjusted region of the image sensor is determined, pixel density distribution of the image sensor can be adjusted. The manner of adjusting the pixel density distribution of the image sensor may be determined according to actual needs, which is not limited in the embodiment of the subject application.

Optionally, target pixel density distribution information of the image sensor is determined at least according to the to-be-adjusted region, wherein average target pixel density, which corresponds to the to-be-adjusted region, in the determined target pixel density distribution information is distinguished from average target pixel density of other regions of the image sensor; and the pixel density distribution of the image sensor is adjusted according to the determined target pixel density distribution information. The target pixel density distribution information of the image sensor is generally configured to represent relative expectation of a user or device for image definition of different regions of the to-be-shot scene. For example, for a region (such as the first region) with high expectation for image definition of the to-be-shot scene, target pixel density of an imaging region, corresponding to at least one sub-lens which affects light field capture of the first region, of the image sensor is greater, to achieve capture of higher resolution of a light field of the region; for other regions in the to-be-shot scene except the first region, requirements for image quality definition can be reduced properly, target pixel density of an imaging region, corresponding to at least one sub-lens which affects light field capture of other regions, of the image sensor is smaller, and light fields of the other regions can be acquired through down-sampling. In this way, a difference exists between target pixel density of imaging regions, corresponding to light field capture of different regions of the to-be-shot scene, of the image sensor. The solution adjusts pixel density distribution of the image sensor according to the target pixel density distribution information, to cause the adjusted pixel density distribution of the image sensor to correspond to the target pixel density distribution information, or to cause the adjusted pixel density distribution of the image sensor to get the target pixel density distribution information as close as possible, thus better meeting users' actual application demands. In this way, light field capture is performed on the to-be-shot scene via the adjusted image sensor, which can make full use of overall pixels of the image sensor to cause differential distribution to exist between spatial resolution of sub-images, corresponding to different regions of the to-be-shot scene, and in light field images acquired, spatial resolution of a sub-image corresponding to a region which a user or device is more interested in is higher, which thus improves light field capture efficiency and imaging effects and improves user experience.

Further, optionally, the determining target pixel density distribution information at least according to the to-be-adjusted region comprises: determining at least one view according to a view set of the at least one sub-lens; determining an imaging sub-region, which corresponds to the at least one view, in the to-be-adjusted region as a to-be-adjusted sub-region according to a third mapping relationship between views of sub-lenses and imaging sub-regions of the image sensor; and determining the target pixel density distribution information according to the to-be-adjusted region and the to-be-adjusted sub-region, average target pixel density, which corresponds to the to-be-adjusted region, in the determined target pixel density distribution information being distinguished from average target pixel density of other regions of the image sensor, and average target pixel density which corresponds to the to-be-adjusted sub-region being distinguished from average target pixel density of other sub-regions of the to-be-adjusted region.

In the process of performing light field capture of the to-be-shot scene based on the light field camera, light field information of a certain region (or called a certain object point) of the to-be-shot scene is recorded by an imaging region of the image sensor corresponding to a sub-lens, which affects light field capture of the region, and in the sub-lens array, the imaging region not only records light intensity distribution information of the region but also records light direction information of different views of the region, which is equivalent to forming multiple sub-images of different views of the region of the to-be-shot scene on the imaging region. For example, in terms of the to-be-adjusted region of the image sensor, the to-be-adjusted region may be divided into multiple sub-regions (hereinafter referred to as "to-be-adjusted sub-region"), and each to-be-adjusted sub-region records light intensity and other information of a certain view of a certain region of the to-be-shot scene. The more the light direction information recorded by the image sensor is, the greater the angular resolution of the image acquired through light field capture is, and in this way, the particle size of subsequent focusing based on a result of light field capture is finer. For example, an imaging unit of the image sensor corresponding to each sub-lens records light direction information of ±5° of a certain direction (e.g., a horizontal direction and/or a vertical direction) of a certain region of the to-be-shot scene, and different pixels of the imaging unit respectively record parallax sub-images of multiple different view angles, such as 0° (also called positive view), ±1°, ±2°, ±3°, ±4° and ±5° of corresponding directions of the same region of the to-be-shot scene. In subsequent process of light field capture data, a clear focus image of a view can be generated according to a sub-image of the corresponding view, so as to acquire re-focused images of different views after shooting.

Figure 3:
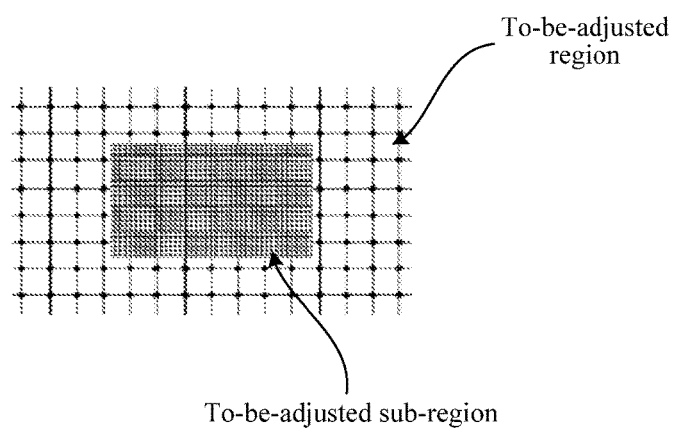
FIG. 3 is an optional example of target pixel density distribution of a to-be-adjusted region of an image sensor according to one embodiment of the subject application.

The inventor of the subject application has found in the process of implementing the embodiments of the subject application that, generally, when light field capture of a to-be-shot scene is performed based on a light field camera, pixels of imaging regions, corresponding to sub-lenses, of an image sensor are evenly distributed, and angular resolution of a certain region of the scene acquired based on different imaging units of the image sensor is also the same. However, in some scenes, different views of the same region of the scene usually has different meanings and/or significance for users, that is, the users do not have the same requirements for imaging quality of different views of the same region of the to-be-shot scene. For example, in a parking lot shooting scene, a user or device is more interested in a license plate region than in other regions, and even for the license plate region, requirements for imaging quality of a positive view (0°) of the license plate region are higher than those for imaging quality of another view; and so on. To this end, the solution determines an imaging sub-region, which corresponds to the at least one view determined in a view set of at least one sub-lens affecting light field capture of a certain region of the to-be-shot scene, in the to-be-adjusted region as a to-be-adjusted sub-region; the target pixel density distribution information is determined according to the to-be-adjusted region and the to-be-adjusted sub-region, to adjust pixel density distribution of the image sensor accordingly, to cause average target pixel density of the to-be-adjusted region of the adjusted image sensor to be distinguished from (such as greater than) that of other regions of the image sensor, and average target pixel density of the to-be-adjusted sub-region to be distinguished from (such as greater than) that of other sub-regions of the to-be-adjusted region, and optional distribution of pixel density of the to-be-adjusted region after adjustment is as shown in FIG. 3. In this way, light field capture is performed on the to-be-shot scene via the adjusted image sensor, on the basis that the technical effect of the technical solution can be achieved, differential distribution may exist between spatial resolution, corresponding to different views of the same region of the to-be-shot scene, of images acquired by light fields, and for imaging regions of one or more views of a region in which a user or device is interested in the to-be-shot scene, more pixels are assigned to record light field information indicating that corresponding views are richer, thus improving angular resolution of sub-images corresponding to the views, improving light field capture efficiency and imaging effects, better meeting users' actual application demands and improving user experience.

According to the embodiment of the subject application, after the target pixel density distribution information is acquired, pixel density distribution of the image sensor can be adjusted according to the target pixel density distribution information, after adjustment, pixel density of a local imaging region of the image sensor is large while a local imaging region of the image sensor is small, and/or, in terms of the same imaging region of the image sensor, pixel density of local sub-regions, corresponding to some views, of the imaging region is large while pixel density of local sub-regions corresponding to other views is small (in a tolerance range of adjustment, the pixel density of the local sub-regions may even be adjusted as 0, that is, light field information of the view angels is not recorded, etc.). During actual applications, the manner of adjusting pixel density distribution of the image sensor can be selected according to actual needs, which is not limited in the embodiment of the subject application. In one optional implementation, deformation control information of a controllable deformed material portion is determined according to the target pixel density distribution information; and the controllable deformed material portion is controlled to produce deformation according to the deformation control information, so as to correspondingly adjust the pixel density distribution of the image sensor through the deformation of the controllable deformed material portion. The solution adjusts pixel distribution of the image sensor by controlling deformation of a controllable deformed material portion, and the solution is simple and easy to implement.

The controllable deformed material portion can produce deformation by changing a certain external effect factor (such as an external field) acting on the controllable deformed material portion, and when the external field acting thereon is cancelled or changed, the deformation of the controllable deformed material portion can be restored.

Figure 1B:
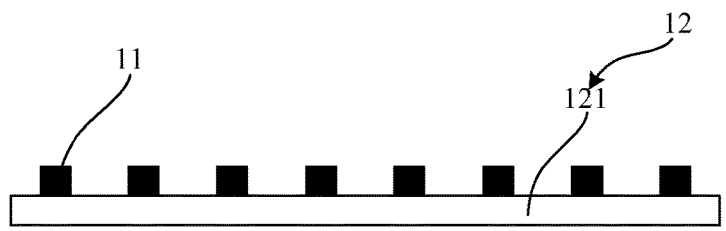
FIG. 1b is a schematic structural diagram of a first image sensor with adjustable pixel density according to one embodiment of the subject application.

FIG. 1b is a schematic structural diagram of an image sensor with adjustable pixel density according to one embodiment of the subject application. As shown in FIG. 1b, the image sensor with adjustable pixel density provided in the embodiment of the subject application comprises: multiple image sensor pixels 11 and a controllable deformed material portion 12, wherein the image sensor performs image capture through the image sensor pixels 11, the multiple image sensor pixels 11 are array-distributed, and the controllable deformed material portion 12 is connected with the multiple image sensor pixels 11 respectively; the controllable deformed material portion 12 may produce deformation under the action of an external field, and density distribution of the multiple image sensor pixels 11 is correspondingly adjusted through the deformation of the controllable deformed material portion 12.

In the technical solution provided in the embodiment of the subject application, the controllable deformed material portion can produce deformation by changing a certain external field effect factor on the controllable deformed material portion, when the certain external field effect factor is cancelled or changed, the deformation of the controllable deformed material portion can be restored, and a corresponding control external field acting thereon may be selected as the external field with respect to deformation characteristics of the controllable deformed material portion, for example, the external field comprises, but is not limited to, an external electric field, a magnetic field, a light field and the like. The image sensor pixels may comprise, but are not limited to, at least one photoelectric conversion unit. Each of the image sensor pixels and the controllable deformed material portion may be closely connected in a manner which comprises, but is not limited to, adhesion, in this way, when the controllable deformed material portion produces deformation, spacing between the image sensor pixels will be adjusted correspondingly, thus changing density distribution of the image sensor pixels and achieving the effect of giving differentiated pixel density distribution to different regions of the image sensor according to actual requirements.

During actual applications, an unevenly distributed external field can act on different regions of the controllable deformed material portion, to cause different regions of the controllable deformed material portion to produce deformation differently, thus adjusting the overall density distribution of the image sensor pixels. Optionally, the external field can act on a region where the controllable deformed material portion and the multiple image sensor pixels do not overlap, to cause a region where the controllable deformed material portion and the multiple image sensor pixels overlap not to produce deformation, and the pixel density distribution of the image sensor is changed through deformation of other parts of the controllable deformed material portion; the solution helps to avoid damage to the image sensor pixels caused by deformation of the controllable deformed material portion.

During actual applications, at least one suitable controllable deformed material can be selected as required to prepare the controllable deformed material portion, to cause the controllable deformed material portion to have characteristics of being deformable and having recoverable deformation. Optionally, the controllable deformed material portion is prepared from at least one of the following controllable deformed materials: piezoelectric materials, electroactive polymers, photodeformation materials and magnetostriction materials.

The piezoelectric materials may produce mechanical deformation due to the action of an electric field. The controllable deformed material portion prepared from the piezoelectric materials is hereinafter referred to as a piezoelectric material portion. By use of such a physical property of the piezoelectric material, the embodiment of the subject application can determine electric field control information configured to make the piezoelectric material portion produce corresponding mechanical deformation according to, but not limited to, the target pixel density distribution information, control an electric field acting on the piezoelectric material portion according to the electric field control information, to cause the piezoelectric material portion to produce corresponding mechanical deformation, and correspondingly adjust pixel density distribution of the image sensor through the mechanical deformation of the piezoelectric material portion, thus achieving the purpose of adjusting pixel density distribution of the image sensor according to the target pixel density distribution information. The piezoelectric materials may comprise, but are not limited to, at least one of the following: piezoelectric ceramic and piezoelectric crystal. The solution can make full use of the physical property of the piezoelectric material to adjust pixel density distribution of the image sensor.

The Electroactive Polymers (referred to as EAPs) are one kind of polymer materials that can change their shapes or sizes under the action of an electric field. The controllable deformed material portion prepared from the EAPs is hereinafter referred to as an EAP portion. By use of such a physical property of the EAPs, the embodiment of the subject application can determine electric field control information configured to make the EAP portion produce corresponding deformation according to, but not limited to, the target pixel density distribution information, control an electric field acting on an EAP layer according to the electric field control information, to cause the EAP layer to produce corresponding deformation, and correspondingly adjust pixel density distribution of the image sensor through the deformation of the EAP layer, thus achieving the purpose of adjusting pixel density distribution of the image sensor according to the target pixel density distribution information. The EAP materials may comprise, but are not limited to, at least one of the following: electronic EAPs and ionic EAPs; the electronic EAPs comprise at least one of the following: ferroelectric polymers (such as polyvinylidene fluoride), electrostrictive grafted elastomers and liquid crystal elastomers; and the ionic EAPs comprise at least one of the following: electrorheological fluids, ionic polymer-metallic composite materials and the like. The solution can make full use of the physical property of the EAPs to adjust pixel density distribution of the image sensor.

The photodeformation materials are one kind of polymer materials that can change their shapes or sizes under the action of a light field. The controllable deformed material portion prepared from the photodeformation materials is hereinafter referred to as a photodeformation material portion. By use of such a physical property of the photodeformation materials, the embodiment of the subject application can determine light field control information configured to make the photodeformation material portion produce corresponding deformation according to, but not limited to, the target pixel density distribution information, control a light field acting on the photodeformation material portion according to the light field control information, to cause the photodeformation material portion to produce corresponding deformation, and correspondingly adjust pixel density distribution of the image sensor through the deformation of the photodeformation material portion, thus achieving the purpose of adjusting pixel density distribution of the image sensor according to the target pixel density distribution information. The photodeformation materials may comprise, but are not limited to, at least one of the following: photostrictive ferroelectric ceramics and photodeformation polymers; the photostrictive ferroelectric ceramics comprise, but are not limited to, lead lanthanum zirconate titanate (PLZT) ceramics, and the photodeformation polymers comprise, but are not limited to, photodeformation liquid crystal elastomers. The solution can make full use of the physical property of the photodeformation material to adjust pixel density distribution of the image sensor.

The magnetostriction materials are one kind of magnetic materials that can change a magnetization state thereof under the action of a magnetic field and then change their sizes. The controllable deformed material portion prepared from the magnetostriction materials is hereinafter referred to as a magnetostriction material portion. By use of such a physical property of the magnetostriction materials, the embodiment of the subject application can determine magnetic field control information configured to make the magnetostriction material produce corresponding deformation according to, but not limited to, the target pixel density distribution information, control a magnetic field acting on the magnetostriction material portion according to the magnetic field control information, to cause the magnetostriction material portion to produce corresponding deformation, and correspondingly adjust pixel density distribution of the image sensor through the deformation of the magnetostriction material portion, thus achieving the purpose of adjusting pixel density distribution of the image sensor according to the target pixel density distribution information. The magnetostriction materials may comprise, but are not limited to, rare-earth giant magnetostrictive materials, such as alloy $Tbo_{0.3}Dy_{0.7}Fe_{1.95}$ materials using a $(Tb,Dy)Fe_2$ compound as a substrate. The solution can make full use of the physical property of the magnetostriction material to adjust pixel density distribution of the image sensor.

In the technical solution provided in the embodiment of the subject application, specific structures and connecting modes of the image sensor pixels and the controllable deformed material portion can be determined according to actual requirements, and the actual modes are very flexible.

In one optional implementation, as shown in FIG. 1b, the controllable deformed material portion 12 comprises: a controllable deformed material layer 121, the multiple image sensor pixels 11 being array-distributed and connected to one side of the controllable deformed material layer 121. Optionally, it is feasible to choose to directly from the multiple image sensor pixels on the controllable deformed material portion 12 according to actual process conditions, or the multiple image sensor pixels and the controllable deformed material portion 12 can be prepared respectively and can be closely connected in a manner which comprises, but is not limited to, adhesion. The solution has a simple structure and is easy to implement.

Figure 1C:
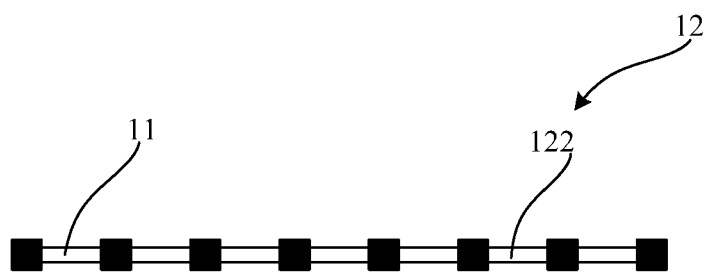
FIG. 1c is a schematic structural diagram of a second image sensor with adjustable pixel density according to one embodiment of the subject application.

In another optional implementation, as shown in FIG. 1c, the controllable deformed material portion 12 comprises multiple controllable deformed material connecting sub-portions 122, the multiple controllable deformed material connecting sub-portions 122 being array-distributed, so as to correspondingly connect the multiple image sensor pixels 11 array-distributed, that is, the multiple image sensor pixels array-distributed are connected into one piece through the multiple controllable deformed material connecting sub-portions array-distributed. Optionally, the multiple controllable deformed material connecting sub-portions can be formed in spacing regions of pixels of an image sensor pixel array according to an actual process, and the multiple controllable deformed material connecting sub-portions and the corresponding image sensor pixels may be connected in a manner which comprises, but is not limited to, abutment and adhesion. The density distribution of the image sensor pixels can be adjusted by controlling deformation of the multiple controllable deformed material connecting sub-portions; the structure is simple and is easy to implement.

Figure 1D:
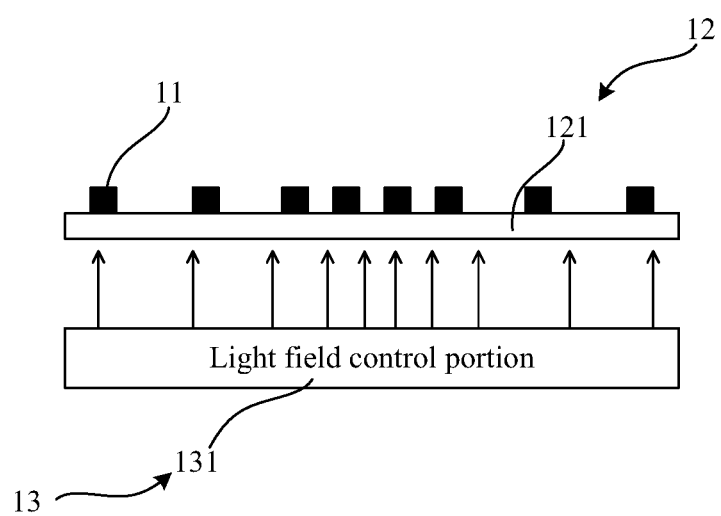
FIG. 1d is a schematic structural diagram of a third image sensor with adjustable pixel density according to one embodiment of the subject application.
Figure 1E:
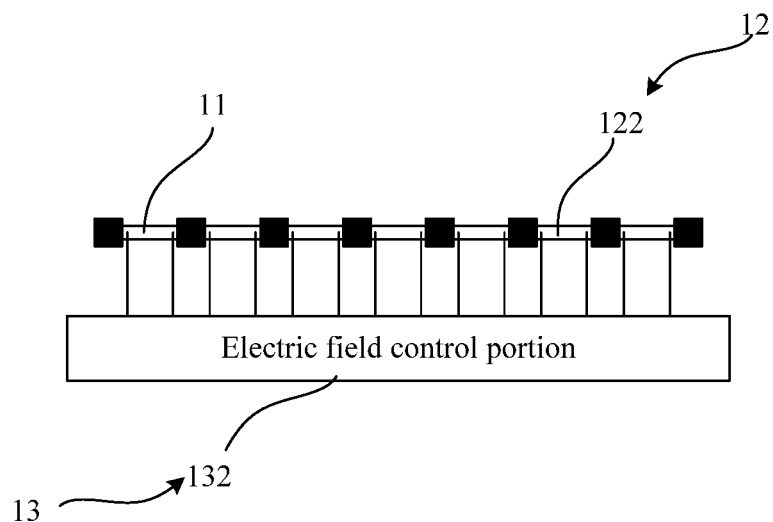
FIG. 1e is a schematic structural diagram of a fourth image sensor with adjustable pixel density according to one embodiment of the subject application.

Further, as shown in FIG. 1d and FIG. 1e, the image sensor may further comprise: a deformation control portion 13, wherein the deformation control portion 13 is configured to adjust distribution of the external field acting on the controllable deformed material portion 12, so as to control the controllable deformed material portion 12 to produce corresponding deformation, in this way, when the controllable deformed material portion 12 produces deformation, the spacing between the image sensor pixels 11 may be adjusted correspondingly, thus changing density distribution of the image sensor pixels 11 and achieving the effect of giving differentiated pixel density distribution to different regions of the image sensor according to actual requirements.

Optionally, as shown in FIG. 1d, the deformation control portion comprises a light field control portion 131, wherein the light field control portion 131 is configured to adjust distribution of an external light field acting on the controllable deformed material portion 12, so as to control the controllable deformed material portion 12 to produce corresponding deformation. In this case, the controllable deformed material portion 12 may comprise a photodeformation material portion at least prepared from photodeformation materials, for example, the photodeformation material portion may comprise a photodeformation material layer at least prepared from the photodeformation materials, or the controllable deformed material portion may comprise multiple photodeformation material connecting sub-portions at least prepared from the photodeformation materials. The light field control portion 131 excites different regions of the controllable deformed material portion 12 to produce deformation differently by changing light field distribution acting on the photodeformation material portion (in FIG. 1d, the light field with different intensity distribution acting on the controllable deformed material portion 12 is represented through arrow density), and the spacing between the image sensor pixels 11 is adjusted correspondingly through the deformation of the controllable deformed material portion 12, thus changing density distribution of the image sensor pixels 11 and achieving the effect of giving differentiated pixel density distribution to different regions of the image sensor according to actual requirements.

Figure 1F:
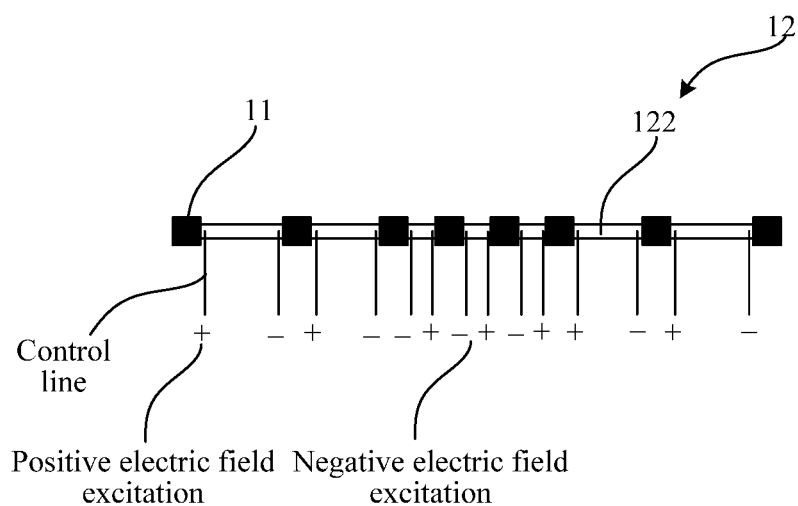
FIG. 1f is an example of a scene where an image sensor adjusts pixel density in the event of uneven light field excitation according to one embodiment of the subject application.

Optionally, as shown in FIG. 1e, the deformation control portion comprises an electric field control portion 132, wherein the electric field control portion 132 is configured to adjust distribution of an external electric field acting on the controllable deformed material portion, so as to control the controllable deformed material portion to produce corresponding deformation. In this case, the controllable deformed material portion 12 may comprise a piezoelectric material portion at least prepared from piezoelectric materials (such as a piezoelectric material layer or a piezoelectric material connecting sub-portion), or the controllable deformed material portion 12 may comprise an EAP portion at least prepared from EAPs (such as an EAP layer or an EAP connecting sub-portion). As shown in FIG. 1e, the electric field control portion and the controllable deformed material can be connected through a control line, and the electric field control portion 132 excites different regions of the controllable deformed material portion 12 to produce deformation differently by changing electric field distribution acting on the controllable deformed material portion. If the electric field acting on the controllable deformed material portion 12 is a zero field, the controllable deformed material portion does not produce deformation (might as well be called zero field excitation); if intensity distribution of the electric field acting on the controllable deformed material portion 12 (for example, "+" positive electric field excitation and "−" negative electric field excitation shown in FIG. 1e) is changed to cause the intensity of the electric field acting on different regions of the controllable deformed material portion 12 to vary, as shown in FIG. 1f, in this way, the different regions of the controllable deformed material portion may produce deformation differently, and the spacing between the image sensor pixels 11 is adjusted correspondingly through the deformation of the controllable deformed material portion 12, thus changing the overall pixel density distribution of the image sensor and achieving the effect of giving differentiated pixel density distribution to different regions of the image sensor according to actual requirements.

In the embodiment of the subject application, the controllable deformed portion and the deformation control portion may be directly or indirectly connected. The deformation control portion may serve as a part of the image sensor, or the deformation control portion may not serve as a part of the image sensor, and the image sensor may also be connected with the deformation control portion through a reserved pin or interface or the like. The external field acting on the controllable deformed material portion may comprise, but is not limited to, an electric field, a magnetic field, a light field and the like. A hardware or software structure configured to produce the electric field, a hardware or software structure configured to produce the magnetic field, a hardware or software structure configured to produce the light field and the like can be achieved by using corresponding existing technologies according to actual requirements, which is no longer repeated herein in the embodiment of the subject application.

Figure 1G:
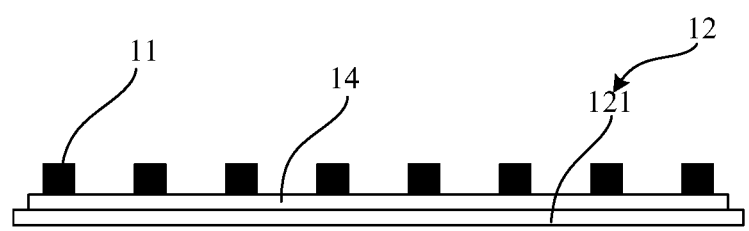
FIG. 1g is a schematic structural diagram of a fifth image sensor with adjustable pixel density according to one embodiment of the subject application.
Figure 1H:
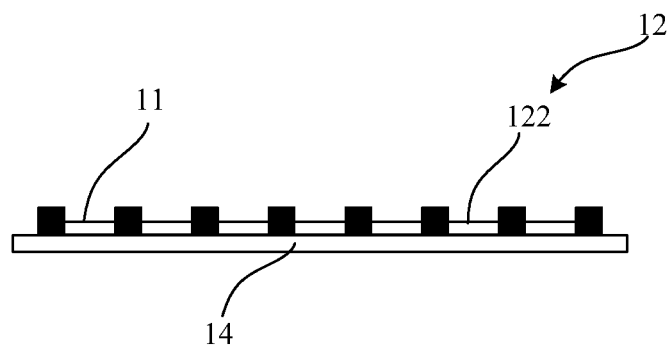
FIG. 1h is a schematic structural diagram of a sixth image sensor with adjustable pixel density according to one embodiment of the subject application.

Optionally, the image sensor may further comprise a flexible substrate, and the flexible substrate may comprise, but is not limited to, a flexible plastic substrate, which has certain flexibility and can change the shape of the flexible substrate according to requirements. The image sensor pixels and the controllable deformed material portion may be disposed on the same side or different sides of the flexible substrate. For example, as shown in FIG. 1g, the multiple image sensor pixels 11 are connected to one side of the flexible substrate 14, and the controllable deformed material portion (for example, the controllable deformed material layer 121) is connected to the other side of the flexible substrate 14. For another example, as shown in FIG. 1h, the multiple image sensor pixels 11 are connected to one side of the flexible substrate 14, and the controllable deformed material portion (for example, the controllable deformed material connecting sub-portion 122) is connected to the corresponding image sensor pixel and is located on the same side of the flexible substrate 14 with the image sensor pixel 11. The solution not only can indirectly adjust the overall pixel density distribution of the image sensor by controlling its deformation through the external field acting on the controllable deformed material portion, to achieve adjustable pixel density of the image sensor, but also can flexibly change the shape of the image sensor due to use of the flexible substrate, for example, a plane image sensor is bent to a certain angle to obtain a surface image sensor, thus meeting application demands such as diversified image capture and decoration.

Figure 1I:
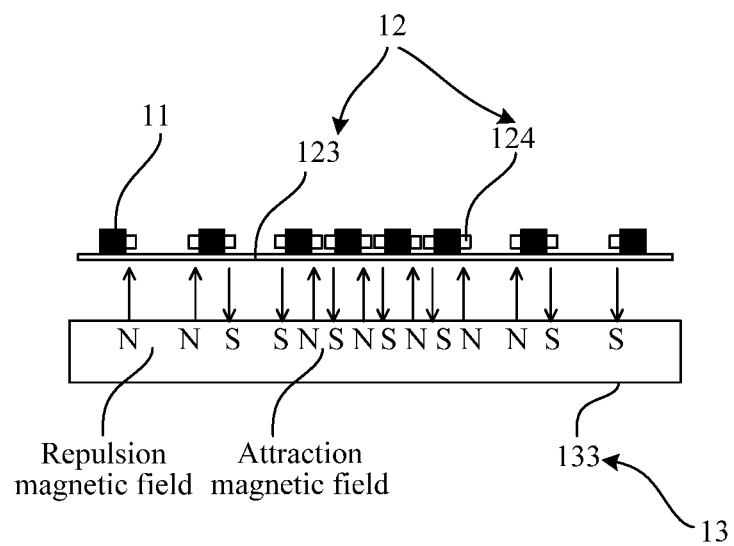
FIG. 1i is a schematic structural diagram of a seventh image sensor with adjustable pixel density according to one embodiment of the subject application.

FIG. 1i is a schematic structural diagram of a seventh image sensor with adjustable pixel density according to one embodiment of the subject application. In the image sensor as shown in FIG. 1i, the controllable deformed material portion 12 comprises: a flexible substrate 123 and multiple permeability magnetic material portions 124; the multiple image sensor pixels 11 are respectively connected with the flexible substrate 123, at least a part of the image sensor pixels 11 are connected with the multiple permeability magnetic material portions 124, the flexible substrate 123 produces corresponding deformation by changing a magnetic field acting on the permeability magnetic material portions 124, and density distribution of the multiple image sensor pixels 11 is correspondingly adjusted through the deformation. For example, a permeability magnetic material portion 124 can be disposed on a side face of each image sensor pixel, and optionally, the image sensor pixel 11 is respectively adhered to the flexible substrate 123 and the permeability magnetic material portion 124. The permeability magnetic material portion may comprise a magnetic pole prepared from a permeability magnetic material, and the permeability magnetic material may comprise, but is not limited to, one or more of a soft magnetic material, a silicon steel sheet, a permalloy, ferrite, an amorphous soft magnetic alloy, and a super-microcrystalline soft magnetic alloy. The permeability magnetic material portion prepared from the soft magnetic material has better permeability, and small residual magnetization after cancellation of the magnetic field facilitates next adjustment.

Further, optionally, the deformation control portion 13 in the embodiment of the subject application may further comprise: a magnetic field control portion 133, wherein the magnetic field control portion 133 is configured to adjust distribution of an external magnetic field acting on the controllable deformed material portion, so as to control the controllable deformed material portion to produce corresponding deformation. For example, when the magnetic field control portion 133 controls the magnetic field (that is, excitation magnetic field) acting on the permeability magnetic material portion 124, as shown in FIG. 1i, a like magnetic pole (NN or SS) repulsion magnetic field or an unlike magnetic pole (NS or SN) attraction magnetic field with certain magnetic field intensity distribution is applied between adjacent image sensor pixels, the poles may produce a corresponding repelling force or attracting force therebetween, the magnetic force is transferred to the flexible substrate 123 to make the flexible substrate 123 produce deformation such as expansion and contraction, thereby resulting in that the spacing between the corresponding image sensor pixels changes and achieving the purpose of adjusting pixel density distribution of the image sensor. The solution achieves adjustable pixel density distribution of the image sensor in combination with scalable deformation characteristics of the flexible substrate and the magnetic field control principle.

Figure 1J:
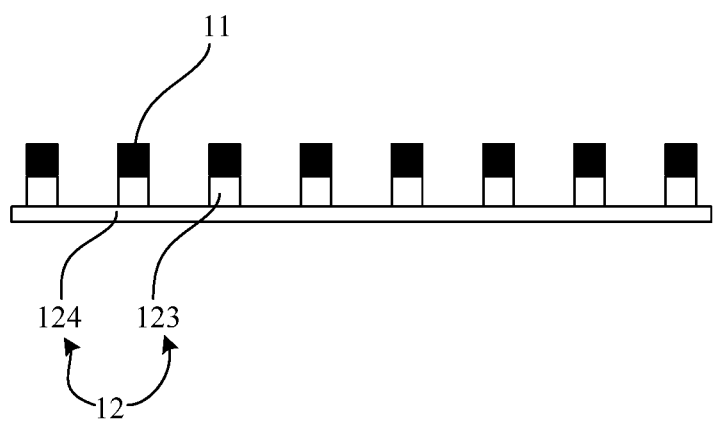
FIG. 1j is a schematic structural diagram of an eighth image sensor with adjustable pixel density according to one embodiment of the subject application.

FIG. 1j is a schematic structural diagram of an eighth image sensor with adjustable pixel density according to one embodiment of the subject application. In the image sensor as shown in FIG. 1j, the controllable deformed material portion 12 comprises: a flexible substrate 123 and multiple permeability magnetic material portions 124; one side of the multiple permeability magnetic material portions 124 is respectively connected with the flexible substrate 123, an opposite face of the multiple permeability magnetic material portions 124 is respectively connected with the multiple image sensor pixels 11 correspondingly, the flexible substrate 123 produces corresponding deformation by changing a magnetic field acting on the permeability magnetic material portions 124, and density distribution of the multiple image sensor pixels 11 is correspondingly adjusted through the deformation. Optionally, the permeability magnetic material portions 124 are adhered to the flexible substrate 123, the image sensor pixels 11 are adhered to the permeability magnetic material portions 124, and when the magnetic field acting on the permeability magnetic material portions 124 changes, the magnetic force is transferred to the flexible substrate 123 to make the flexible substrate 123 produce deformation such as expansion and contraction, thereby achieving the purpose of adjusting pixel density distribution of the image sensor. The solution achieves adjustable pixel density distribution of the image sensor in combination with scalable deformation characteristics of the flexible substrate and the magnetic field control principle.

After pixel density distribution of the image sensor is adjusted according to the target pixel density distribution information, image capture of the to-be-shot scene is performed, and during image capture, various image sensor pixels of the image sensor all participate in the image capture. As pixel density distribution of the image sensor has been adjusted according to the image target pixel density distribution information and the image target pixel density distribution information is determined according to target depth-of-field information of the to-be-shot scene, an image of the to-be-shot scene is acquired according to the adjusted image sensor, definition of different regions of the acquired image presents differential distribution corresponding to the target pixel density distribution information, in a part requiring clear presentation relative to the target depth-of-field information, there will be more pixels participating in the image capture, image definition of the part is higher, details are richer, and image capture efficiency is improved; while in a part, which does not require clear presentation, of the target depth-of-field information, relatively few pixels participate in the image capture, and images of the part are fuzzy, which thus makes full use of pixels of the image sensor to achieve image effects of shallow depth-of-field on the whole and can better meet users' diversified application demands.

According to the embodiment of the subject application, after image capture is performed according to the image sensor whose pixel density distribution is adjusted, an image acquired can be scanned and output, for example, pixel index information of the image sensor can be acquired; and the acquired image is scanned and output according to the pixel index information. The pixel index information of the image sensor comprises: original position information of respective image sensor pixels before the pixel density distribution of the image sensor is adjusted. Image scanning and output is performed according to the pixel index information in a certain scan manner (line by line scan, column by column scan, interlaced scan or the like); as a certain offset exists between actual position information of pixels and corresponding pixel index information during image capture of the image sensor, an image for image scanning and output according to the pixel index information is a deformed image with an abnormal display scale relative to an originally acquired image. The deformed image, relative to the originally acquired image, the size of a region corresponding to great pixel density in the deformed image is greater than that in the originally acquired image, for example, a head portion is acquired based on a region of the image sensor with greater pixel density, in this case, the head portion in the deformed image obtained through scanning and output is greater than that in the originally acquired image, in this way, the users can see the portion that they need to focus on more conveniently, which increases efficiency of image display and improves users' visual experience.

If it is necessary to obtain a non-deformed image whose display scale is unchanged relative to a preview image, the acquired image is output according to pixel position information of the image sensor after judgment, to obtain a restored image with a normal display scale corresponding to the preview image.

It should be understood by those skilled in the art that, in any one of the foregoing methods of the specific implementations of the subject application, the value of the serial number of each step described above does not mean an execution sequence, and the execution sequence of each step should be determined according to the function and internal logic thereof, and should not be any limitation to the implementation procedure of the specific implementations of the subject application.

Figure 4:
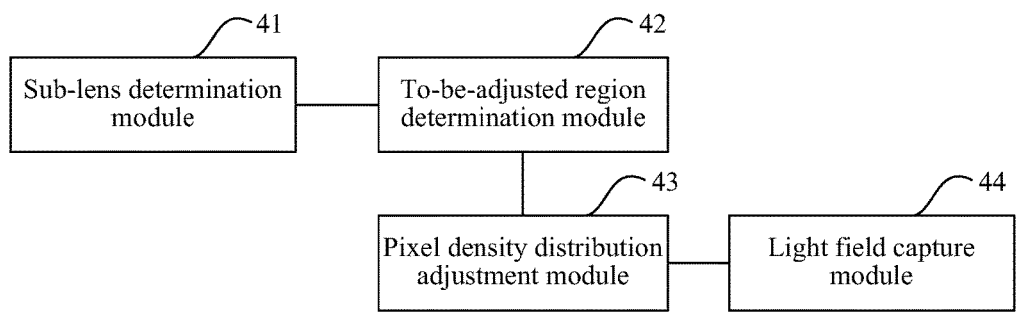
FIG. 4 is a logic block diagram of a first light field capture control apparatus according to one embodiment of the subject application.

FIG. 4 is a logic block diagram of a first light field capture control apparatus according to one embodiment of the subject application. As shown in FIG. 4, a first light field capture control apparatus according to the embodiment of the subject application comprises: a sub-lens determination module 41, a to-be-adjusted region determination module 42, a pixel density distribution adjustment module 43 and a light field capture module 44.

The sub-lens determination module 41 is configured to determine at least one sub-lens, which affects light field capture of a first region, in a sub-lens array of a light field camera, the first region being a local part of a to-be-shot scene.

The to-be-adjusted region determination module 42 is configured to determine a to-be-adjusted region of an image sensor of the light field camera according to the at least one sub-lens.

The pixel density distribution adjustment module 43 is configured to adjust pixel density distribution of the image sensor, to cause average pixel density distribution of the to-be-adjusted region to be distinguished from that of other regions of the image sensor. The "distinguished from" is "different from", comprising "greater than" or "less than", that is to say, pixel density distribution of the image sensor is adjusted, to cause average pixel density of the to-be-adjusted region of the image sensor to be greater than that of other regions of the image sensor, or to cause average pixel density of the to-be-adjusted region of the image sensor to be less than that of other regions of the image sensor.

The light field capture module 44 is configured to perform, by the adjusted image sensor, light field capture of the to-be-shot scene.

The technical solution provided in the embodiment of the subject application determines a to-be-adjusted region of an image sensor according to at least one sub-lens, which affects light field capture of a first region, in a sub-lens array of a light field camera, adjusts pixel density distribution of the image sensor, to cause average pixel density distribution of the to-be-adjusted region to be distinguished from that of other regions of the image sensor, that is, the adjusted pixel density distribution of the image sensor is not evenly distributed, and when light field capture of the to-be-shot scene is performed via the adjusted image sensor, light field information of different regions of the to-be-shot scene recorded by the image sensor is not even, which thus improves light field capture efficiency while making full use of overall pixels of the image sensor, and can better meet users' diversified actual application demands.

Device manifestations of the light field capture control apparatus are not limited, for example, the light field capture control apparatus may be a certain separate component, and the component cooperates with the light field camera for communications; or the light field capture control apparatus may be integrated, as a certain functional module, into an image capture device comprising a light field camera, which is not limited in the embodiment of the subject application.

Figure 5:
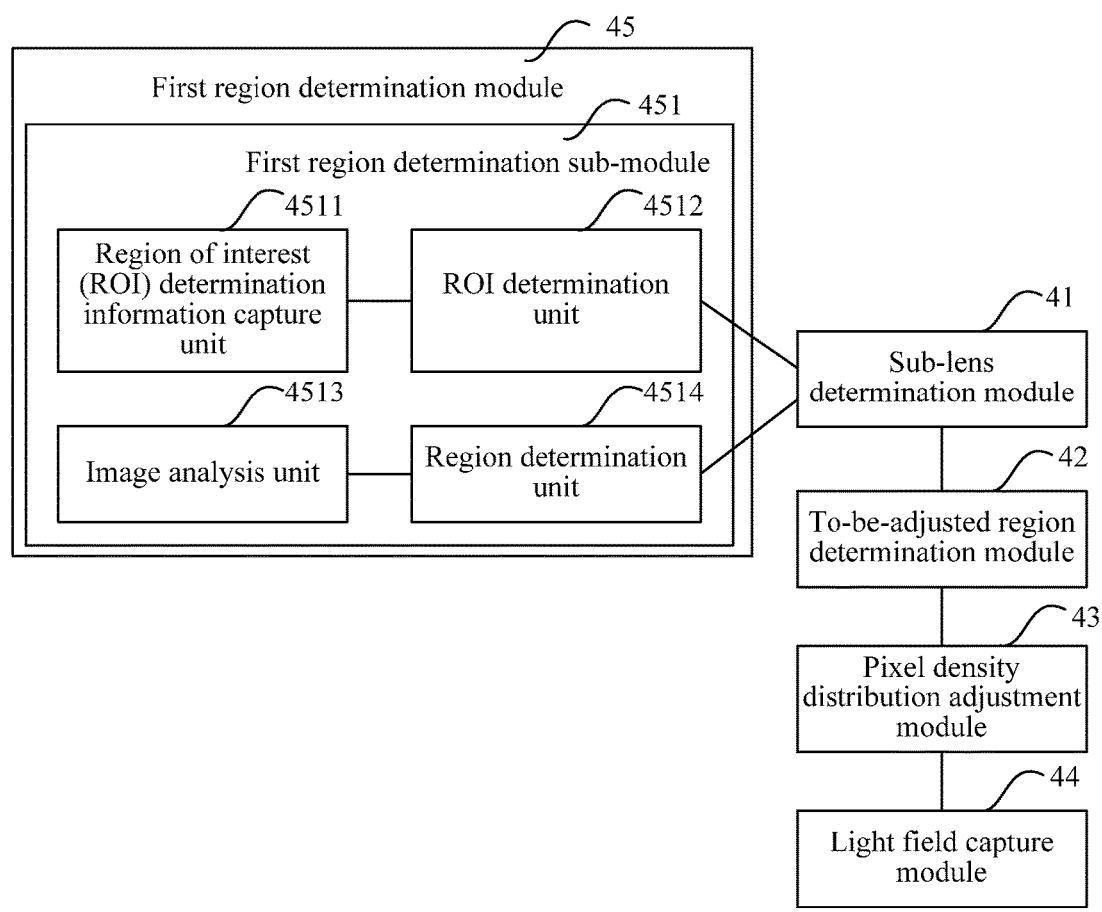
FIG. 5 is a logic block diagram of a second light field capture control apparatus according to one embodiment of the subject application.
Figure 6:
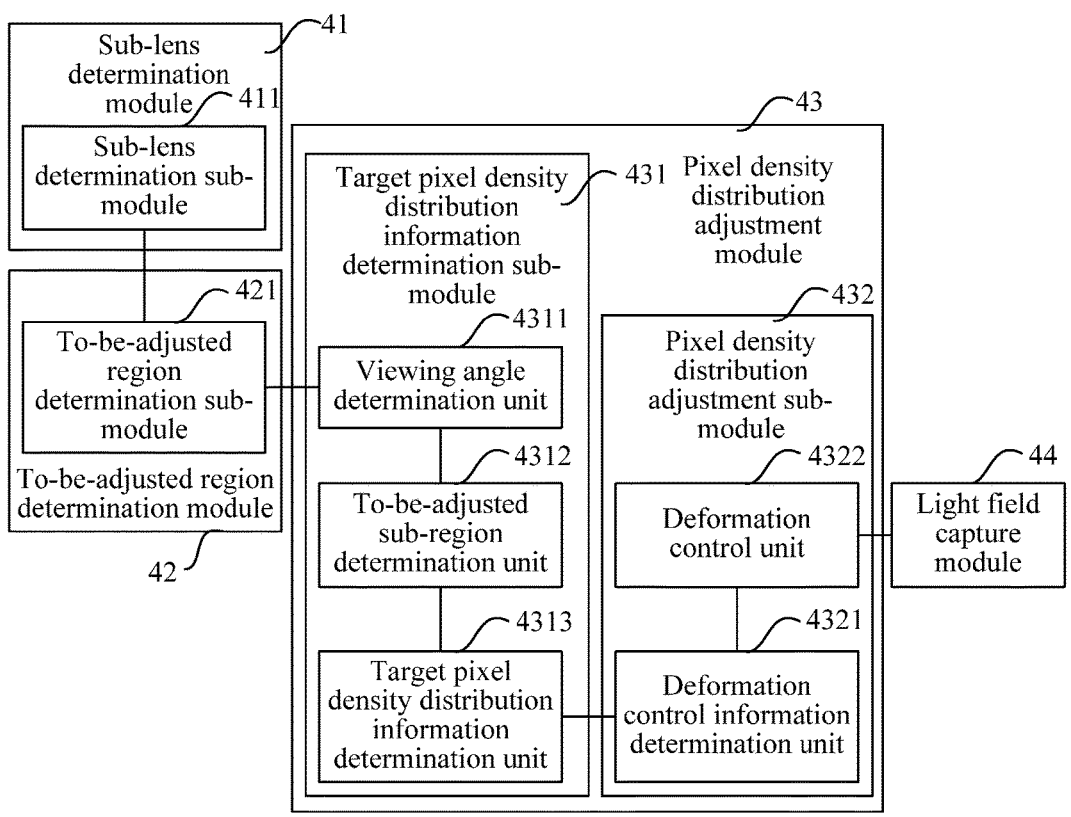
FIG. 6 is a logic block diagram of a third light field capture control apparatus according to one embodiment of the subject application.

Optionally, as shown in FIG. 5, the light field capture control apparatus further comprises: a first region determination module 45. The first region determination module 45 is configured to determine the first region. The solution can determine a local part of the to-be-shot scene as the first region according to actual needs, and implementation thereof is very flexible.

Optionally, the first region determination module 45 comprises: a first region determination sub-module 451. The first region determination sub-module 451 is configured to determine the first region according to a preview image of any view of the to-be-shot scene acquired by the light field camera. The solution determines the first region based on the preview image, and can improve use convenience of users.

Optionally, the first region determination sub-module 451 comprises: an ROI determination information capture unit 4511 and an ROI determination unit 4512. The ROI determination information capture unit 4511 is configured to acquire ROI determination information of the preview image; and the ROI determination unit 4512 is configured to determine the first region according to the ROI determination information. The solution causes determination of the first region to more fit in with actual user demands, and can better meet users' personalized application demands.

Optionally, the first region determination sub-module 451 comprises: an image analysis unit 4513 and a region determination unit 4514. The image analysis unit 4513 is configured to perform image analysis on the preview image; and the region determination unit 4514 is configured to determine the first region according to a result of the image analysis. The solution causes determination of the first region to be more intelligent, thereby improving efficiency and universality of the determination of the first region.

Optionally, as shown in FIG. 2, the light field camera comprises a main lens, a sub-lens array and an image sensor disposed in sequence; the sub-lens array comprises multiple array-distributed sub-lenses, and the sub-lenses have the same focal length; and a distance between the image sensor and the sub-lens array is equal to the focal length of the sub-lenses.

Corresponding to results of the light field camera, as shown in FIG. 5, the sub-lens determination module 41 comprises: a sub-lens determination sub-module 411. The sub-lens determination sub-module 411 is configured to determine the at least one sub-lens corresponding to pixels comprised in a sub-image, which corresponds to the first region, in the preview image according to a first mapping relationship between pixel distribution of the preview image and sub-lens distribution of the sub-lens array. The to-be-adjusted region determination module 42 comprises: a to-be-adjusted region determination sub-module 421. The to-be-adjusted region determination sub-module 421 is configured to determine an imaging region, which corresponds to the at least one sub-lens, in the image sensor as the to-be-adjusted region according to a second mapping relationship between sub-lens distribution of the sub-lens array and imaging region distribution of the image sensor. The solution is simple and easy to implement, and improvise use convenience of users.

Optionally, the pixel density distribution adjustment module 43 comprises: a target pixel density distribution information determination sub-module 431 and a pixel density distribution adjustment sub-module 432. The target pixel density distribution information determination sub-module 431 is configured to determine target pixel density distribution information of the image sensor at least according to the to-be-adjusted region, average target pixel density, which corresponds to the to-be-adjusted region, in the determined target pixel density distribution information being distinguished from average target pixel density of other regions of the image sensor; and the pixel density distribution adjustment sub-module 432 is configured to adjust the pixel density distribution of the image sensor according to the determined target pixel density distribution information. The solution adjusts pixel density distribution of the image sensor according to the target pixel density distribution information, to cause the adjusted pixel density distribution of the image sensor to correspond to the target pixel density distribution information, or to cause the adjusted pixel density distribution of the image sensor to get the target pixel density distribution information as close as possible, thus better meeting users' actual application demands.

Optionally, the target pixel density distribution information determination sub-module 431 comprises: a viewing angle determination unit 4311, a to-be-adjusted sub-region determination unit 4312 and a target pixel density distribution information determination unit 4313. The viewing angle determination unit 4311 is configured to determine at least one view according to a view set of the at least one sub-lens; the to-be-adjusted sub-region determination unit 4312 is configured to determine an imaging sub-region, which corresponds to the at least one view, in the to-be-adjusted region as a to-be-adjusted sub-region according to a third mapping relationship between views of sub-lenses and imaging sub-regions of the image sensor; and the target pixel density distribution information determination unit 4313 is configured to determine the target pixel density distribution information according to the to-be-adjusted region and the to-be-adjusted sub-region, average target pixel density, which corresponds to the to-be-adjusted region, in the determined target pixel density distribution information being distinguished from average target pixel density of other regions of the image sensor, and average target pixel density which corresponds to the to-be-adjusted sub-region being distinguished from average target pixel density of other sub-regions of the to-be-adjusted region. In this way, light field capture is performed on the to-be-shot scene via the adjusted image sensor, on the basis that the technical effect of the technical solution can be achieved, differential distribution may exist between spatial resolution, corresponding to different views of the same region of the to-be-shot scene, of images acquired by light fields, and for imaging regions of one or more views of a region in which a user or device is interested in the to-be-shot scene, more pixels are assigned to record light field information indicating that corresponding views are richer, thus improving angular resolution of sub-images corresponding to the views, improving light field capture efficiency and imaging effects, better meeting users' actual application demands and improving user experience.

Optionally, the pixel density distribution adjustment sub-module 432 comprises: a deformation control information determination unit 4321 and a deformation control unit 4322. The deformation control information determination unit 4321 is configured to determine deformation control information of a controllable deformed material portion according to the target pixel density distribution information; and the deformation control unit 4322 is configured to control the controllable deformed material portion to produce deformation according to the deformation control information, so as to correspondingly adjust the pixel density distribution of the image sensor through the deformation of the controllable deformed material portion. The controllable deformed material portion can produce deformation by changing a certain external effect factor (such as an external field) acting on the controllable deformed material portion, and when the external field acting thereon is cancelled or changed, the deformation of the controllable deformed material portion can be restored. Optionally, the controllable deformed material portion is prepared from at least one of the following controllable deformed materials: piezoelectric materials, electroactive polymers, photodeformation materials and magnetostriction materials. The solution adjusts pixel distribution of the image sensor by controlling deformation of a controllable deformed material portion, and the solution is simple and easy to implement.

Figure 7:
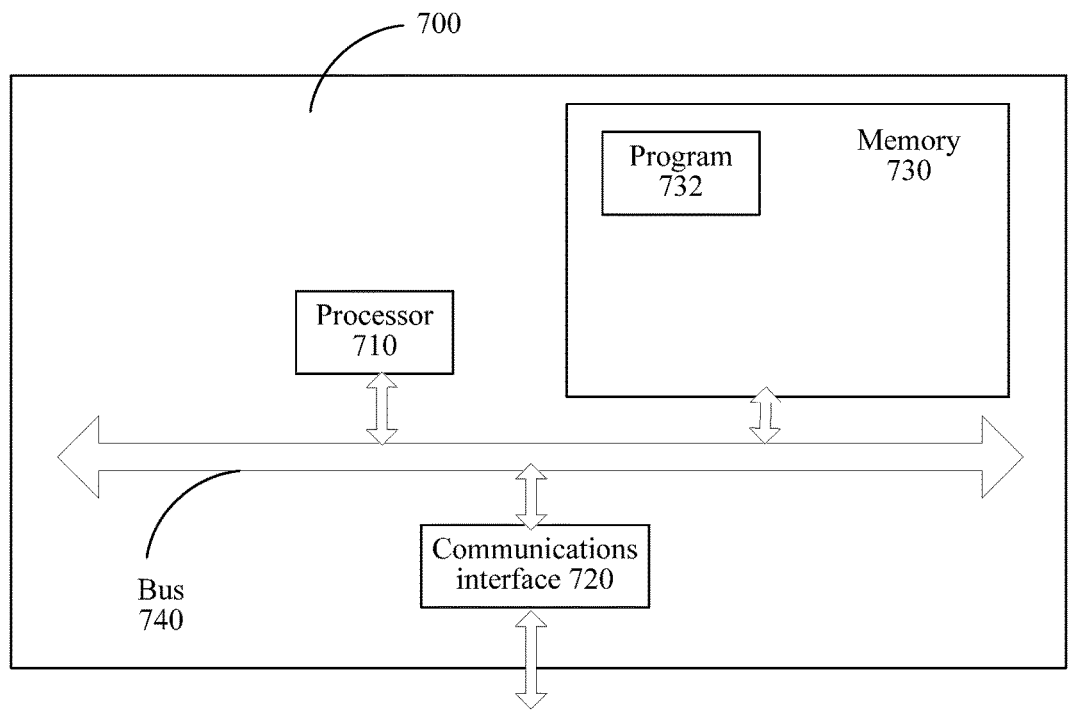
FIG. 7 is a logic block diagram of a fourth light field capture control apparatus according to one embodiment of the subject application.

FIG. 7 is a logic block diagram of a fourth light field capture control apparatus according to one embodiment of the subject application; the specific embodiment of the subject application does not limit specific implementations of the light field capture control apparatus 700. As shown in FIG. 7, the light field capture control apparatus 700 may comprise:

a processor 710, a Communications Interface 720, a memory 730, and a communications bus 740.

The processor 710, the Communications Interface 720, and the memory 730 accomplish mutual communications via the communications bus 740.

The Communications Interface 720 is configured to communicate with, for example, devices or external light sources with a communications function.

The processor 710 is configured to execute a program 732, and specifically, can implement relevant steps in any embodiment of the light field capture control method.

Specifically, the program 732 may comprise a program code, the program code comprising a computer operation instruction.

The processor 710 may be a central processing unit (CPU), or an application specific integrated circuit (ASIC), or be configured to be one or more integrated circuits which implement the embodiments of the subject application.

The memory 730 is configured to store the program 732. The memory 730 may comprise a high-speed RAM memory, and may also comprise a non-volatile memory, for example, at least one magnetic disk memory.

For example, in one optional implementation, the processor 710 may perform the following steps by executing the program 732: determining at least one sub-lens, which affects light field capture of a first region, in a sub-lens array of a light field camera, the first region being a local part of a to-be-shot scene; determining a to-be-adjusted region of an image sensor of the light field camera according to the at least one sub-lens; adjusting pixel density distribution of the image sensor, to cause average pixel density distribution of the to-be-adjusted region to be distinguished from that of other regions of the image sensor; and performing, by the adjusted image sensor, light field capture of the to-be-shot scene.

In other optional implementations, the processor 710 may further perform the steps mentioned in the any other embodiments by executing the program 732, which is not repeated herein.

Reference can be made to corresponding description in the corresponding steps, modules, sub-modules and units in the embodiments for specific implementation of the steps in the program 732, which is not repeated herein. Those skilled in the art can clearly understand that, reference can be made to the corresponding process description in the method embodiments for the devices described above and the specific working procedures of the modules, and will not be repeated herein in order to make the description convenient and concise.

Figure 8:
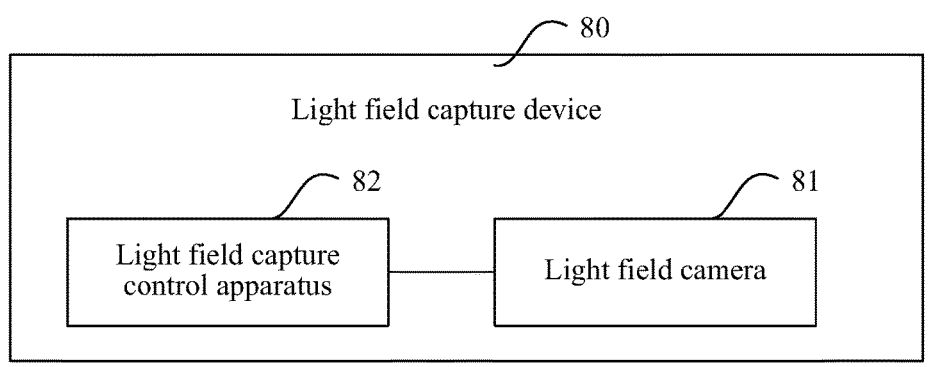
FIG. 8 is a logic block diagram of a light field capture device according to one embodiment of the subject application.

FIG. 8 is a logic block diagram of a light field capture device according to one embodiment of the subject application. As shown in FIG. 8, a light field capture device 80 according to the embodiment of the subject application comprises a light field camera 81 and a light field capture control apparatus 82, and the light field capture control apparatus 82 is connected with the light field capture device 80. Reference can be made to the description in the corresponding embodiment above for the structure and the working principle of the light field capture control apparatus 82, which is not repeated herein. The light field camera may comprise, but is not limited to: devices with phototaking, camera shooting, photographing, video monitoring and other light field capture functions, for example, it may be, but is not limited to, the following device types: a camera, a mobile phone, a webcam, a video camera, a video tape recorder and the like.

The technical solution provided in the embodiment of the subject application determines a to-be-adjusted region of an image sensor according to at least one sub-lens, which affects light field capture of a first region, in a sub-lens array of a light field camera, adjusts pixel density distribution of the image sensor, to cause average pixel density distribution of the to-be-adjusted region to be distinguished from that of other regions of the image sensor, that is, the adjusted pixel density distribution of the image sensor is not evenly distributed, and when light field capture of the to-be-shot scene is performed via the adjusted image sensor, light field information of different regions of the to-be-shot scene recorded by the image sensor is not even, which thus improves light field capture efficiency while making full use of overall pixels of the image sensor, and can better meet users' diversified actual application demands.

Optionally, the image sensor may be the flexible image sensor described above. Alternatively, the image sensor may further comprise: multiple image sensor pixels array-distributed; and a controllable deformed material portion respectively connected with the multiple image sensor pixels; wherein the controllable deformed material portion can produce deformation under the action of an external field, and density distribution of the multiple image sensor pixels is correspondingly adjusted through the deformation; the external field is controlled by the imaging control apparatus.

Reference can be made to the corresponding description in FIG. 1*b* to FIG. 1*j* for the structure of the image sensor, the imaging control apparatus can directly control the external field to control deformation of the controllable deformed material portion, thereby adjusting pixel density distribution of the image sensor; or the imaging control apparatus can indirectly control the external field by controlling the deformation control portion, to cause the controllable deformed material portion to produce corresponding deformation to correspondingly adjust pixel density distribution of the image sensor; and so on. A manner in which the image sensor pixels and the deformed material portion are physically connected can be determined according to actual needs, as long as the manner can meet that pixel density distribution of the image sensor can be adjusted when the deformed material portion produces deformation, which is not limited in the embodiment of the subject application, and reference can be made to the corresponding description above for a specific implementation thereof; reference can be made to FIG. 2 and the corresponding description above for the light path structure of the light field camera, which is not repeated herein.

In the various embodiments of the subject application, the serial numbers and/or sequence numbers of the foregoing embodiments are merely for the convenience of description, and do not imply the preference among the embodiments. Particular emphasis is put on the description about each embodiment, and reference can be made to relevant description of other embodiments for the content not detailed in a certain embodiment. Reference can be made to the description about the corresponding method embodiments for related description about the implementation principle or process of relevant apparatus, device or system embodiments, which is not repeated herein.

It can be appreciated by those of ordinary skill in the art that each exemplary unit and method step described with reference to the embodiments disclosed herein can be implemented by electronic hardware or a combination of computer software and electronic hardware. Whether these functions are executed in a hardware mode or a software mode depends on particular applications and design constraint conditions of the technical solution. The professional technicians can use different methods to implement the functions described with respect to each particular application, but such implementation should not be considered to go beyond the scope of the subject application.

If the functions are implemented in the form of a software functional unit and is sold or used as an independent product, it can be stored in a computer-readable storage medium. Based on such understanding, the technical solution of the subject application essentially or the part which contributes to the prior art or a part of the technical solution can be embodied in the form of a software product, and the computer software product is stored in a storage medium, and comprises several instructions for enabling a computer device (which can be a personal computer, a server, or a network device, and the like) to execute all or some steps of the method described in each embodiment of the subject application. The foregoing storage medium comprises, a USB disk, a removable hard disk, a read-only memory (ROM), a random access memory (RAM), a magnetic disk, an optical disk or any other mediums that can store program codes.

In the embodiments of the apparatuses, methods and systems of the subject application, it is apparent that the members (systems, sub-systems, modules, sub-modules, units, sub-units, and the like) or the steps can be decomposed, combined and/or recombined after decomposition. The decomposition and/or recombination should be regarded as equivalent solutions of the subject application. Moreover, in the description about the embodiments of the subject application, features described and/or illustrated with respect to one implementation may be used in one or more other implementations in the same or a similar manner, be combined with features in other implementations, or replace the features in other implementations.

It should be emphasized that, the term "comprise" used herein refers to existence of features, elements, steps or components, but does not exclude existence or addition of one or more other features, elements, steps or components.

Finally, it should be noted that, the above implementations are only intended to describe the subject application rather than to limit the subject application; various changes and variations can be made by those of ordinary skill in the art without departing from the spirit and scope of the subject application, so all equivalent technical solutions also belong to the category of the subject application, and the scope of patent protection of the subject application should be defined by the claims.

What is claimed is:

1. A light field capture control method, comprising:
   determining at least one sub-lens, which affects light field capture of a first region, in a sub-lens array of a light field camera, the first region being a local part of a to-be-shot scene;
   determining a to-be-adjusted region of an image sensor of the light field camera according to the at least one sub-lens;
   adjusting pixel density distribution of the image sensor, to cause average pixel density distribution of the to-be-adjusted region to be distinguished from that of other regions of the image sensor; and
   performing, by the adjusted image sensor, light field capture of the to-be-shot scene.

2. The light field capture control method of claim 1, further comprising determining the first region.

3. The light field capture control method of claim 2, wherein the determining the first region comprises:
   determining the first region according to a preview image of any view of the to-be-shot scene acquired by the light field camera.

4. The light field capture control method of claim 3, wherein the determining the first region according to a preview image comprises:
   acquiring region of interest (ROI) determination information of the preview image; and
   determining the first region according to the ROI determination information.

5. The light field capture control method of claim 3, wherein the determining the first region according to a preview image comprises:
   performing image analysis on the preview image; and
   determining the first region according to a result of the image analysis.

6. The light field capture control method of claim 1, wherein:
   the light field camera comprises a main lens, a sub-lens array, and an image sensor disposed in sequence;
   the sub-lens array comprises multiple array-distributed sub-lenses with the same focal length; and
   a distance between the image sensor and the sub-lens array is equal to the focal length of the sub-lenses.

7. The light field capture control method of claim 6, wherein the determining at least one sub-lens, which affects light field capture of a first region, in a sub-lens array of a light field camera comprises:
   determining the at least one sub-lens corresponding to pixels comprised in a sub-image, which corresponds to the first region, in a preview image according to a first mapping relationship between pixel distribution of the preview image and sub-lens distribution of the sub-lens array.

8. The light field capture control method of claim 6, wherein the determining a to-be-adjusted region of an image sensor according to the at least one sub-lens comprises:
   determining an imaging region, which corresponds to the at least one sub-lens, in the image sensor as the to-be-adjusted region according to a second mapping relationship between sub-lens distribution of the sub-lens array and imaging region distribution of the image sensor.

9. The light field capture control method of claim 1, wherein the adjusting pixel density distribution of the image sensor comprises:
determining target pixel density distribution information of the image sensor at least with respect to the to-be-adjusted region, wherein an average target pixel density, which corresponds to the to-be-adjusted region, in the determined target pixel density distribution information is distinguished from an average target pixel density of other regions of the image sensor; and
adjusting the pixel density distribution of the image sensor according to the determined target pixel density distribution information.

10. The light field capture control method of claim 9, wherein the determining target pixel density distribution information of the image sensor at least with respect to the to-be-adjusted region comprises:
determining at least one view according to a view set of the at least one sub-lens;
determining an imaging sub-region, which corresponds to the at least one view, in the to-be-adjusted region as a to-be-adjusted sub-region according to a third mapping relationship between views of sub-lenses and imaging sub-regions of the image sensor; and
determining the target pixel density distribution information with respect to the to-be-adjusted region and the to-be-adjusted sub-region, wherein the average target pixel density, which corresponds to the to-be-adjusted region, in the determined target pixel density distribution information is distinguished from the average target pixel density of other regions of the image sensor, and an average target pixel density which corresponds to the to-be-adjusted sub-region is distinguished from an average target pixel density of other sub-regions of the to-be-adjusted region.

11. The light field capture control method of claim 9, wherein the adjusting the pixel density distribution of the image sensor according to the determined target pixel density distribution information comprises:
determining deformation control information of a controllable deformed material portion according to the target pixel density distribution information; and
controlling the controllable deformed material portion to produce deformation according to the deformation control information, so as to correspondingly adjust the pixel density distribution of the image sensor through the deformation of the controllable deformed material portion.

12. The light field capture control method of claim 11, wherein the controllable deformed material portion is prepared from at least one of the following controllable deformed materials: piezoelectric materials, electroactive polymers, photodeformation materials and magnetostriction materials.

13. A light field capture control apparatus, characterized by comprising a processor and a memory, the memory storing computer executable instructions, the processor being connected to the memory through a communication bus, and when the apparatus for controlling task migration operates, the processor executing the computer executable instructions stored in the memory, so that the apparatus for controlling task migration executes operations, comprising:
determining at least one sub-lens, which affects light field capture of a first region, in a sub-lens array of a light field camera, the first region being a local part of a to-be-shot scene;
determining a to-be-adjusted region of an image sensor of the light field camera according to the at least one sub-lens;
adjusting pixel density distribution of the image sensor, to cause average pixel density distribution of the to-be-adjusted region to be distinguished from that of other regions of the image sensor; and
performing, by the adjusted image sensor, light field capture of the to-be-shot scene.

14. The light field capture control apparatus of claim 13, wherein the operations further comprise:
determining the first region.

15. The light field capture control apparatus of claim 14, wherein the operations further comprise:
determining the first region according to a preview image of any view of the to-be-shot scene acquired by the light field camera.

16. The light field capture control apparatus of claim 15, wherein the operations further comprise:
acquiring ROI determination information of the preview image; and
determining the first region according to the ROI determination information.

17. The light field capture control apparatus of claim 15, wherein the operations further comprise:
performing image analysis on the preview image; and
determining the first region according to a result of the image analysis.

18. The light field capture control apparatus of claim 13, wherein:
the light field camera comprises a main lens, a sub-lens array and an image sensor disposed in sequence;
the sub-lens array comprises multiple array-distributed sub-lenses with the same focal length; and
a distance between the image sensor and the sub-lens array is equal to the focal length of the sub-lenses.

19. The light field capture control apparatus of claim 18, wherein the operations further comprise:
determining the at least one sub-lens corresponding to pixels comprised in a sub-image, which corresponds to the first region, in a preview image according to a first mapping relationship between pixel distribution of the preview image and sub-lens distribution of the sub-lens array.

20. The light field capture control apparatus of claim 18, wherein the operations further comprise:
determining an imaging region, which corresponds to the at least one sub-lens, in the image sensor as the to-be-adjusted region according to a second mapping relationship between sub-lens distribution of the sub-lens array and imaging region distribution of the image sensor.

21. The light field capture control apparatus of claim 13, wherein the operations further comprise:
determining target pixel density distribution information of the image sensor at least with respect to the to-be-adjusted region, wherein an average target pixel density, which corresponds to the to-be-adjusted region, in the determined target pixel density distribution information is distinguished from an average target pixel density of other regions of the image sensor; and adjusting the pixel density distribution of the image sensor according to the determined target pixel density distribution information.

22. The light field capture control apparatus of claim 21, wherein the operations further comprise:
   determining at least one view according to a view set of the at least one sub-lens;
   determining an imaging sub-region, which corresponds to the at least one view, in the to-be-adjusted region as a to-be-adjusted sub-region according to a third mapping relationship between views of sub-lenses and imaging sub-regions of the image sensor; and
   determining the target pixel density distribution information with respect to the to-be-adjusted region and the to-be-adjusted sub-region, wherein the average target pixel density, which corresponds to the to-be-adjusted region, in the determined target pixel density distribution information is distinguished from the average target pixel density of other regions of the image sensor, and an average target pixel density which corresponds to the to-be-adjusted sub-region is distinguished from an average target pixel density of other sub-regions of the to-be-adjusted region.

23. The light field capture control apparatus of claim 22, wherein the operations further comprise:
   determining deformation control information of a controllable deformed material portion according to the target pixel density distribution information; and
   controlling the controllable deformed material portion to produce deformation according to the deformation control information, so as to correspondingly adjust the pixel density distribution of the image sensor through the deformation of the controllable deformed material portion.

24. The light field capture control apparatus of claim 23, wherein the controllable deformed material portion is prepared from at least one of the following controllable deformed materials: piezoelectric materials, electroactive polymers, photodeformation materials and magnetostriction materials.

25. A light field capture device, comprising a light field camera and a light field capture control apparatus, wherein the light field capture control apparatus comprises one or more processors and one or more non-transitory computer-readable memories coupled to the one or more processors and configured with instructions executable by the one or more processors to cause the system to perform operations comprising:
   determining at least one sub-lens, which affects light field capture of a first region, in a sub-lens array of a light field camera, the first region being a local part of a to-be-shot scene;
   determining a to-be-adjusted region of an image sensor of the light field camera according to the at least one sub-lens;
   adjusting pixel density distribution of the image sensor, to cause average pixel density distribution of the to-be-adjusted region to be distinguished from that of other regions of the image sensor; and
   performing, by the adjusted image sensor, light field capture of the to-be-shot scene;
   wherein, the light field capture control apparatus is connected with the light field camera.

26. The light field capture device of claim 25, wherein the image sensor comprises:
   multiple image sensor pixels array-distributed; and
   a controllable deformed material portion, respectively connected with the multiple image sensor pixels; wherein the controllable deformed material portion can produce deformation under the action of an external field, and correspondingly adjusts density distribution of the multiple image sensor pixels through the deformation; and the external field is controlled by the light field capture control apparatus.

27. A computer readable storage apparatus, comprising at least one executable instruction, which, in response to execution, causes a light field capture control method, comprising:
   determining at least one sub-lens, which affects light field capture of a first region, in a sub-lens array of a light field camera, the first region being a local part of a to-be-shot scene;
   determining a to-be-adjusted region of an image sensor of the light field camera according to the at least one sub-lens;
   adjusting pixel density distribution of the image sensor, to cause average pixel density distribution of the to-be-adjusted region to be distinguished from that of other regions of the image sensor; and
   performing, by the adjusted image sensor, light field capture of the to-be-shot scene.

* * * * *